United States Patent
Camacho et al.

(10) Patent No.: US 8,957,515 B2
(45) Date of Patent: Feb. 17, 2015

(54) INTEGRATED CIRCUIT PACKAGE SYSTEM WITH ARRAY OF EXTERNAL INTERCONNECTS

(75) Inventors: Zigmund Ramirez Camacho, Singapore (SG); Henry Descalzo Bathan, Singapore (SG); Abelardo Jr. Hadap Advincula, Singapore (SG); Lionel Chien Hui Tay, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 1027 days.

(21) Appl. No.: 11/936,516

(22) Filed: Nov. 7, 2007

(65) Prior Publication Data

US 2009/0115040 A1 May 7, 2009

(51) Int. Cl.
- *H01L 23/48* (2006.01)
- *H01L 23/495* (2006.01)
- *H01L 21/48* (2006.01)
- *H01L 23/31* (2006.01)
- *H01L 23/00* (2006.01)

(52) U.S. Cl.
CPC ...... *H01L 23/49548* (2013.01); *H01L 21/4832* (2013.01); *H01L 23/3107* (2013.01); *H01L 23/49541* (2013.01); *H01L 2224/48091* (2013.01); *H01L 2224/48247* (2013.01); *H01L 2224/49171* (2013.01); *H01L 2924/01046* (2013.01); *H01L 2924/01078* (2013.01); *H01L 2924/14* (2013.01); *H01L 24/48* (2013.01); *H01L 24/49* (2013.01); *H01L 2224/48257* (2013.01); *H01L 2924/15747* (2013.01); *H01L 2224/32245* (2013.01); *H01L 2224/73265* (2013.01)
USPC ............................ 257/692; 257/666; 257/786

(58) Field of Classification Search
USPC .......... 257/676, 687, 692, E23.037, E23.043, 257/690, 784, 786, 666
See application file for complete search history.

(56) References Cited

U.S. PATENT DOCUMENTS

| | | | |
|---|---|---|---|
| 5,340,771 A | 8/1994 | Rostoker | |
| 5,365,409 A | 11/1994 | Kwon et al. | |
| 6,025,650 A | 2/2000 | Tsuji et al. | |
| RE36,894 E | 10/2000 | Greenberg et al. | |
| 6,143,981 A * | 11/2000 | Glenn | 438/123 |
| 6,150,709 A | 11/2000 | Shin et al. | |
| 6,348,726 B1 | 2/2002 | Bayan et al. | |
| 6,498,392 B2 * | 12/2002 | Azuma | 257/676 |
| 6,689,640 B1 | 2/2004 | Mostafazadeh | |
| 6,818,973 B1 | 11/2004 | Foster | |
| 6,836,008 B2 | 12/2004 | Yu et al. | |
| 6,975,038 B1 | 12/2005 | Mostafazadeh | |
| 7,001,798 B2 * | 2/2006 | Yamaguchi | 438/114 |
| 7,026,192 B2 * | 4/2006 | Minamio et al. | 438/123 |
| 7,095,096 B1 | 8/2006 | Mostafazadeh | |
| 7,109,572 B2 | 9/2006 | Fee et al. | |
| 7,112,883 B2 * | 9/2006 | Hasunuma | 257/714 |
| 7,186,588 B1 | 3/2007 | Bayan et al. | |
| 7,247,526 B1 * | 7/2007 | Fan et al. | 438/123 |
| 2005/0236701 A1 | 10/2005 | Minamio et al. | |
| 2007/0093000 A1 | 4/2007 | Shim et al. | |
| 2009/0085177 A1 | 4/2009 | Pisigan et al. | |
| 2009/0236704 A1 | 9/2009 | Camacho et al. | |

* cited by examiner

*Primary Examiner* — Sheila V. Clark
(74) *Attorney, Agent, or Firm* — Ishimaru & Associates LLP

(57) ABSTRACT

An integrated circuit package system includes: forming an array of external interconnects with an intersecting region between the external interconnects; removing the intersecting region for forming an isolation hole between the external interconnects; mounting an integrated circuit die over the external interconnects; connecting an internal interconnect between the integrated circuit die and the external interconnects; and forming a package encapsulation over the integrated circuit die with the external interconnects partially exposed.

10 Claims, 5 Drawing Sheets

INTEGRATED CIRCUIT PACKAGE SYSTEM WITH ARRAY OF EXTERNAL INTERCONNECTS

TECHNICAL FIELD

The present invention relates generally to an integrated circuit package system and more particularly to an integrated circuit leadframe type package system with high I/O density.

BACKGROUND ART

Modern consumer electronics, such as smart phones, personal digital assistants, and location based services devices, as well as enterprise electronics, such as servers and storage arrays, are packing more integrated circuits into an ever shrinking physical space with expectations for decreasing cost. Every new generation of integrated circuits with increased operating frequency, performance and the higher level of large-scale integration have underscored the need for back-end integrated circuit manufacturing to provide more solutions involving the integrated circuit itself. Numerous technologies have been developed to meet these requirements. Some of the research and development strategies focus on new package technologies while others focus on improving the existing and mature package technologies.

Semiconductor package structures continue to advance toward miniaturization and thinning to increase the density of the components that are packaged therein while decreasing the sizes of the products that are made therefrom. This is in response to continually increasing demands on information and communication apparatus for ever-reduced sizes, thicknesses, and costs along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook personal computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor die (or "chip") packages are of the type where a semiconductor die is molded into a package with a resin, such as an epoxy molding compound. The packages have a lead frame whose leads are projected from the package body, to provide a path for signal transfer between the die and external devices. Other conventional package configurations have contact terminals or pads formed directly on the surface of the package.

Such a conventional semiconductor package is fabricated through the following processes: a die-bonding process (mounting the semiconductor die onto the paddle of a lead frame), a wire-bonding process (electrically connecting the semiconductor die on the paddle to inner leads using lead frame wires), a molding process (encapsulating a predetermined portion of the assembly, containing the die, inner leads and lead frame wires, with an epoxy resin to form a package body), and a trimming process (completing each assembly as individual, independent packages).

The semiconductor packages, thus manufactured, are then mounted by matching and soldering the external leads or contact pads thereof to a matching pattern on a circuit board, to thereby enable power and signal input/output ("I/O") operations between the semiconductor devices in the packages and the circuit board.

An exemplary semiconductor package, well known in the electronics industry, is the quad flat nonleaded ("QFN") package. QFN packages typically include a lead frame, such as a conductive sheet stamped and etched, with a semiconductor die having a multitude of bond pads mounted to the top side of the lead frame. Wire bonds electrically connect the bond pads, of the semiconductor die, to a series of conductive lead fingers on the topside of the lead frame. Typically, the semiconductor die and the wire bonds are encapsulated within a molding compound.

In order to reduce manufacturing costs, the electronics industry is increasing the usage of QFN packages. In the manufacturing process, many obstacles must be overcome to deliver extremely small packages with thinner and thinner profile in high volume. Despite the trend towards miniaturization and thinner profile, more functions and more integrated circuits continue to be packed into QFN packages. Typical QFN solutions face problems providing the high density and high count I/O needed for modern electronic products.

Thus, a need still remains for an integrated circuit package system providing low cost manufacturing, improved yield, improved reliability, and high density I/O count. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

An integrated circuit package system includes: forming an array of external interconnects with an intersecting region between the external interconnects; removing the intersecting region for forming an isolation hole between the external interconnects; mounting an integrated circuit die over the external interconnects; connecting an internal interconnect between the integrated circuit die and the external interconnects; and forming a package encapsulation over the integrated circuit die with the external interconnects partially exposed.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
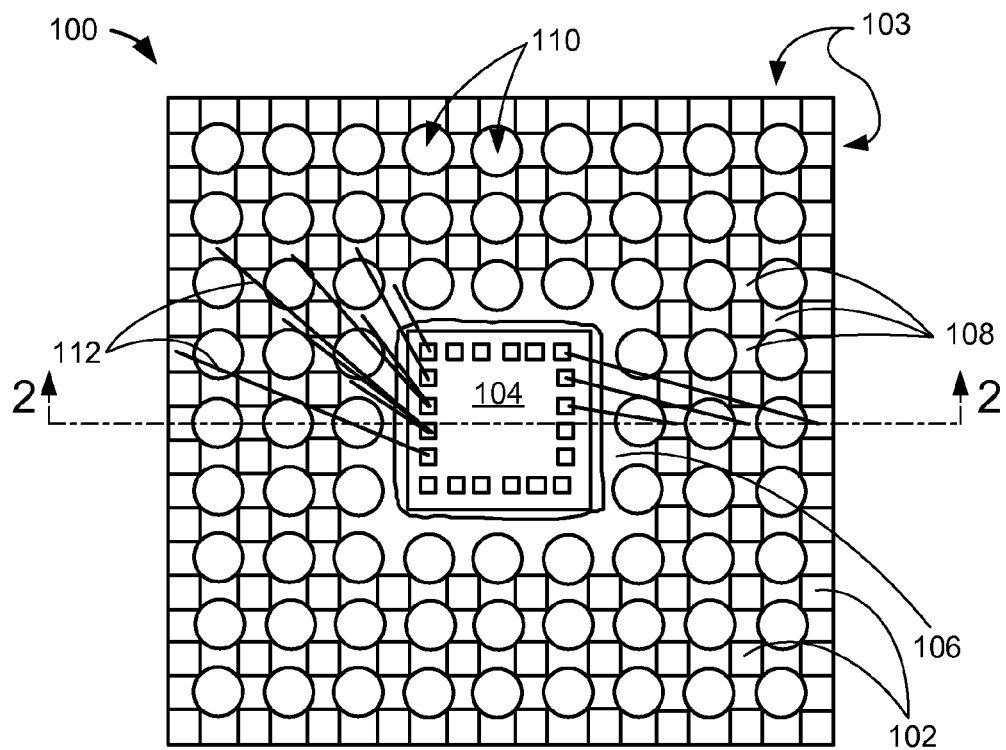
FIG. 1 is a top plan view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features from one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a top plan view of an integrated circuit package system 100 in a first embodiment of the present invention. The top plan view depicts the integrated circuit package system 100 without a top portion of a package encapsulation 102, but with a bottom portion filling a conductive grid 103. The package encapsulation 102 is a molding compound, such as an epoxy molding compound.

An integrated circuit die 104 is mounted over a die-attach paddle 106 in the central area of the conductive grid 103. Isolation holes 110 having a curved shaped opening separate the conductive grid 103 into individual leads or external interconnects 108. In at least one embodiment, at least one of each of the isolation holes 110 can separate or border four (4) of the external interconnects 108. The integrated circuit die 104 and the external interconnects 108 are connected by internal interconnects 112, such as bond wires or ribbon bond wires. For clarity, not all the internal interconnects 112 are shown.

For illustrative purposes, the integrated circuit package system 100 is shown with the external interconnects 108 equally spaced from each other although they may be unequally spaced in other embodiments.

Figure 2:
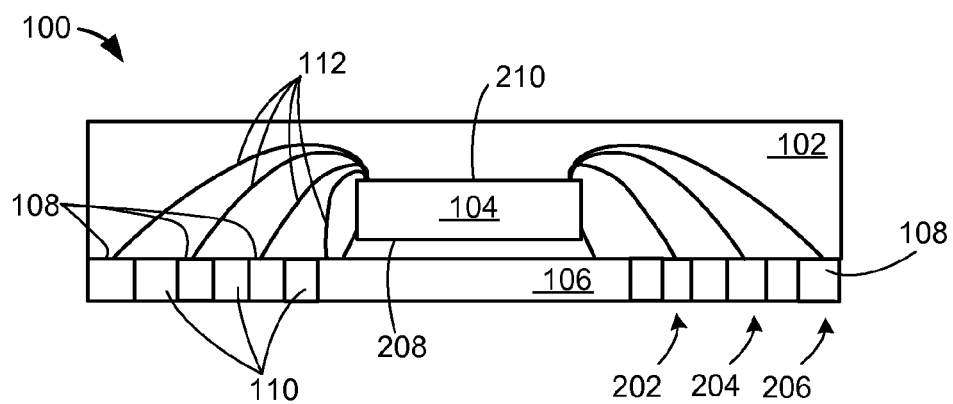
FIG. 2 is a cross-sectional view of an integrated circuit package system along line 2-2 of FIG. 1.

Referring now to FIG. 2, therein is shown a cross-sectional view of the integrated circuit package system 100 along line 2-2 of FIG. 1. The cross-sectional view depicts the integrated circuit die 104 is mounted over the die-attach paddle 106. The cross-sectional view also depicts the isolation holes 110 adjacent to the die-attach paddle 106 and next to the external interconnects 108. The isolation holes 110 and the external interconnects 108 are in alternating position away from the die-attach paddle 106 in the cross-sectional view. The isolation holes 110 separate the different rows of the external interconnects 108. The isolation holes 110 separate a first row 202, a second row 204, and a third row of the external interconnects 108 extending into the page of FIG. 2. The package encapsulation 102 can extend into the isolation holes 110.

As mentioned earlier, the integrated circuit die 104 is mounted over the die-attach paddle 106. The integrated circuit die 104 has a non-active side 208 and an active side 210, wherein the active side 210 includes active circuitry fabricated thereon. The non-active side 208 is facing the die-attach paddle 106, as an example. The internal interconnects 112 connect the integrated circuit die 104 and the external interconnects 108. The package encapsulation 102 covers the integrated circuit die 104, the die-attach paddle 106, and a portion of the external interconnects 108. In this example, the bottoms of the external interconnects 108 and the die-attach paddle 106 are shown as coplanar.

For illustrative purposes, the integrated circuit die 104 is shown as a wire bond integrated circuit, although it is understood that the integrated circuit die 104 may be other types of integrated circuit. For example, the integrated circuit die 104 may be a flip chip.

It has been discovered that the present invention provides low cost, reliable, high density I/O integrated circuit package systems manufactured with the external interconnects or the leads from lead frames. The isolation holes separate the external interconnects from each other. This provides low cost manufacturing while providing high density I/O without an expensive ball grid array (BGA) type package structure.

Figure 3:
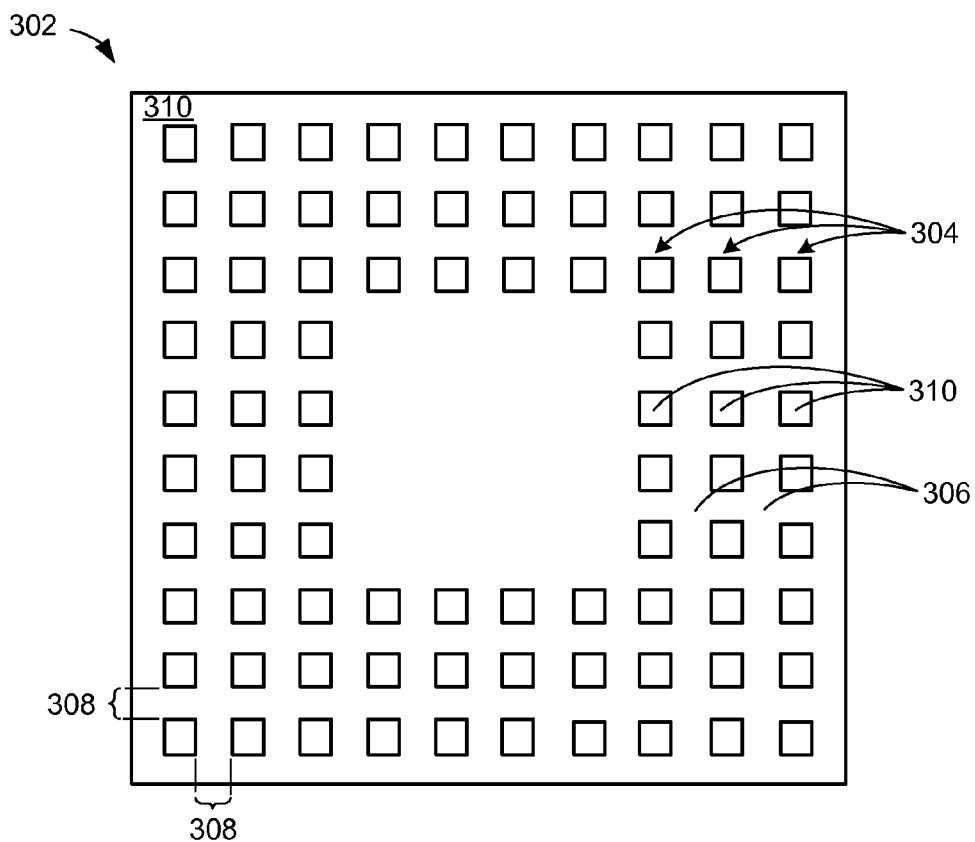
FIG. 3 is a top view of a portion of a first lead frame for forming the integrated circuit package system of FIG. 1.

Referring now to FIG. 3, therein is shown a top view of a portion of a first lead frame 302 for forming of the integrated circuit package system 100 of FIG. 1. The first lead frame 302 may be included in an intermediate step of manufacturing. The first lead frame 302 having a grid configuration is preferably used to construct the grid of the external interconnects 108 of FIG. 1. Perforations 304 are in the first lead frame 302, wherein the perforations 304 are formed in a geometric configuration of a square, as an example. Intersecting regions 306 are portions of the first lead frame 302 where orthogonal segments 308 of the first lead frame 302 intersect each other. The first lead frame 302 may be formed by pre-plating with nickel-palladium. The first lead frame 302 may be optionally pre-molded with an array encapsulation 310 filling the perforations 304.

Figure 4:
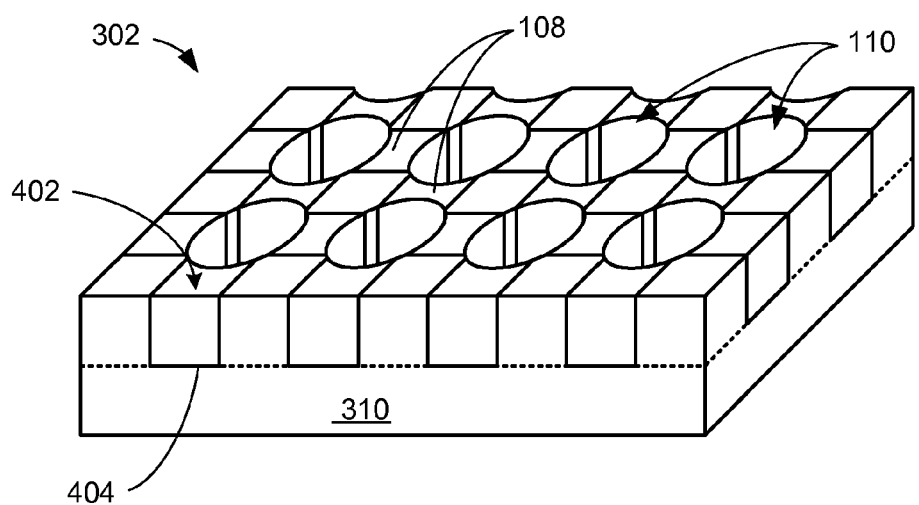
FIG. 4 is an isometric plan view of a portion of the first lead frame of FIG. 3 in a step for forming the isolation holes.

Referring now to FIG. 4, therein is shown an isometric plan view of a portion of the first lead frame 302 of FIG. 3 in a step of forming the isolation holes 110. The isometric view depicts the isolation holes 110 formed in the first lead frame 302 of FIG. 3 by removing the intersecting regions 306 of FIG. 3 to isolate the external interconnects 108 from each other. The array encapsulation 310 is optionally formed by pre-molding the first lead frame 302.

A first side 402 of the external interconnects 108 facing the integrated circuit die 104 of FIG. 1 may be exposed from the array encapsulation 310 for connection between the integrated circuit die 104 and the external interconnects 108. A second side 404 of the external interconnects 108 may be exposed by removing a portion of the array encapsulation 310 or the array encapsulation 310 may be formed to the thickness depicted by the dotted lines exposing the second side 404. The second side 404 is an opposing side to the first side 402 and may connect to the next system level (not shown), such as a printed circuit board or another integrated circuit package system.

Although the integrated circuit die 104 and the package encapsulation 102 of FIG. 1 are not shown in this figure for clarity, it is understood that the package encapsulation 102 may combine with and include the array encapsulation 310. The package encapsulation 102 can extend into the isolation holes 110 and can contact the external interconnects 108 and the array encapsulation 310. A number of methods can be used to remove the intersecting regions 306 for forming the isolation holes 110 including punching, micro-drilling, chemical etching, and laser cutting. The isolation holes 110 may be preferably formed with the integrated circuit die 104 connected with the external interconnects 108.

Figure 5:
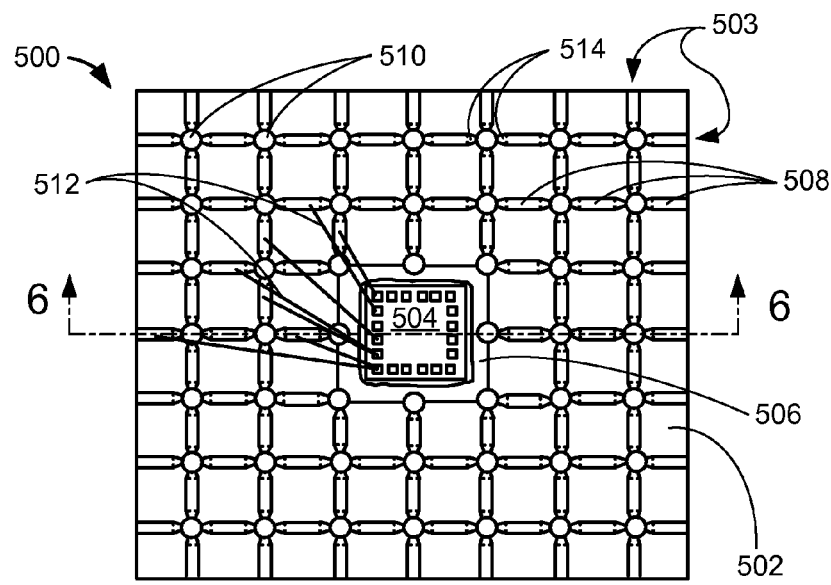
FIG. 5 is a top plan view of an integrated circuit package system in a second embodiment of the present invention.

Referring now to FIG. 5, therein is shown a top plan view of an integrated circuit package system 500 in a second embodiment of the present invention. The top plan view depicts the integrated circuit package system 500 without a top portion of a package encapsulation 502, but with a bottom portion filling a conductive grid 503. The package encapsulation 502 is a molding compound, such as an epoxy molding compound.

An integrated circuit die 504 is mounted over a die-attach paddle 506 in the central area of the conductive grid 503. Isolation holes 510 separate the conductive grid 503 into individual leads or external interconnects 508. The integrated circuit die 504 and the external interconnects 508 are preferably connected by internal interconnects 512, such as bond wires or ribbon bond wires. For clarity, not all the internal interconnects 512 are shown. As an example, the integrated circuit package system 500 includes three rows of the external interconnects 508.

As a further example, the integrated circuit package system 500 may also have the external interconnects 508 having a narrow portion 514. The narrow portion 514 may be adjacent to the isolation holes 510. The narrow portion 514 of the external interconnects 508 is narrower in width than the thickness portion of the external interconnects 508.

For illustrative purposes, the integrated circuit package system 500 is shown with the external interconnects 508 equally spaced from each other although they may be unequally spaced in other embodiments.

Figure 6:
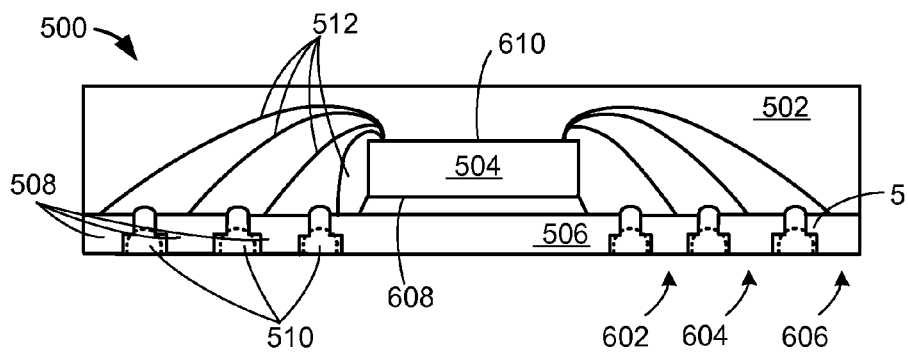
FIG. 6 is a cross-sectional view of an integrated circuit package system along line 6-6 of FIG. 5.

Referring now to FIG. 6, therein is shown a cross-sectional view of the integrated circuit package system 500 along line 6-6 of FIG. 5. The cross-sectional view depicts the integrated circuit die 504 mounted over the die-attach paddle 506. The cross-sectional view also depicts the isolation holes 510 adjacent to the die-attach paddle 506 and next to the external interconnects 508. The isolation holes 510 and the external interconnects 508 are in alternating position away from the die-attach paddle 506 in the cross-sectional view. The isolation holes 510 separate the different row of the external interconnects 508, such as leads. As a more specific description, the isolation holes 510 separate a first row 602, a second row 604 and a third row 606 of the external interconnects 508.

The cross-sectional view depicts the first row 602 of the external interconnects 508 having the narrow portion 514 at one vertical side facing away from the die-attach paddle 506. As an example, the narrow portion 514 is not coplanar with the thickest portion of the external interconnects 508. The second row 604 of the external interconnects 508 include the narrow portion 514 at both vertical sides of the external interconnects 508. The third row 606 of the external interconnects 508 include the narrow portion 514 at one vertical side facing towards the die-attach paddle 506.

For illustrative purposes, the integrated circuit package system 500 is shown with the narrow portion 514 elevated above an exposed side of the external interconnects 508, although it is understood that the external interconnects 508 may be formed in a different configuration. For example, the narrow portion 514 may be coplanar with the exposed side of the external interconnects 508, wherein the exposed side is exposed by the package encapsulation 502.

The isolation holes 510, depicted by arcs, may be formed into the package encapsulation 502 and over an interior top side of the external interconnects 508. As a different example, the isolation holes 510, as depicted by dotted arcs, may be formed into the package encapsulation 502 and not extending over the interior top side of the external interconnects 508.

For illustrative purposes, the integrated circuit package system 500 is shown with the narrow portion 514 not coplanar with the thickest portion of the external interconnects 508. Although, it is understood that the narrow portion may be coplanar with the narrow portions of the rest of the external interconnects 508.

As mentioned earlier, the integrated circuit die 504 is mounted over the die-attach paddle 506. The integrated circuit die 504 has a non-active side 608 and an active side 610, wherein the active side 610 includes active circuitry fabricated thereon. The non-active side 608 is facing the die-attach paddle 506, as an example. The internal interconnects 512 connect the integrated circuit die 504 and the external interconnects 508. The package encapsulation 502 covers the integrated circuit die 504, the die-attach paddle 506, and a portion of the external interconnects 508. In this example, the external interconnects 508 and the die-attach paddle 506 are shown as coplanar.

As a further example, the integrated circuit package system 500 may also have the external interconnects 508 having the narrow portion 514. The narrow portion 514 may be adjacent to the isolation holes 510. The narrow portion 514 may not be coplanar with the die-attach paddle 506. The package encapsulation 502 may be under the narrow portion 514.

For illustrative purposes, the integrated circuit die 504 is shown as a wire bond integrated circuit, although it is understood that the integrated circuit die 504 may be other types of integrated circuit. For example, the integrated circuit die 504 may be a flip chip.

It has been discovered that the present invention provides low cost, reliable, high-density I/O integrated circuit package systems manufactured with the external interconnects or the leads from lead frames. The isolation holes separate the leads from each other. The narrow portion of the leads serves as mold lock features improving the leads structural placement in the encapsulation. This provides low cost manufacturing while providing high density I/O without an expensive ball grid array (BGA) type package structure.

Figure 7:
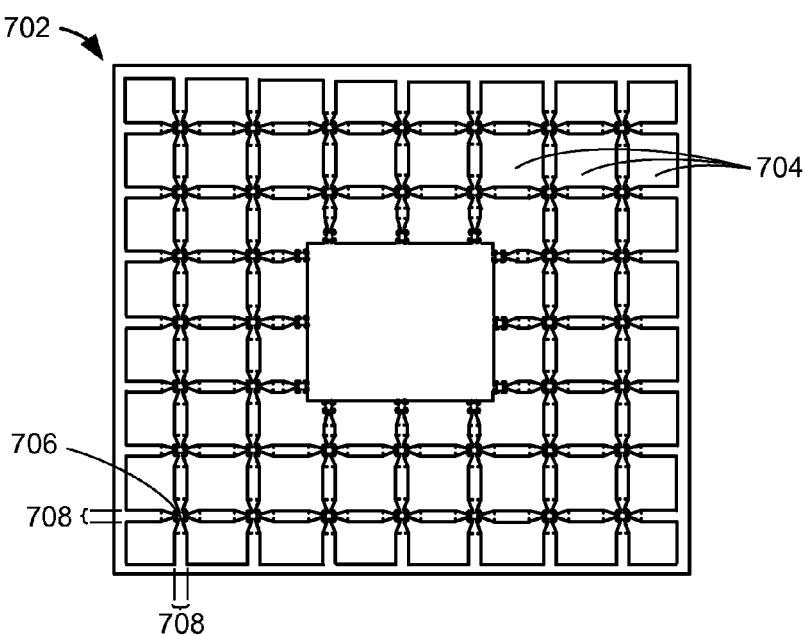
FIG. 7 is a top view of a portion of a second lead frame for forming the integrated circuit package system of FIG. 5.

Referring now to FIG. 7, therein is shown a top view of a portion of a second lead frame 702 for forming the integrated circuit package system 500 of FIG. 5. The second lead frame 702 may be included in an intermediate step of manufacturing. The second lead frame 702 having a grid configuration is preferably used to construct the grid of the external interconnects 508 of FIG. 5. Perforations 704 are preferably in the second lead frame 702. Intersecting regions 706 are portions of the second lead frame 702 where orthogonal segments 708 of the second lead frame 702 intersect each other. The second lead frame 702 may be formed by pre-plating with nickel-palladium on a copper lead frame. The second lead frame 702 may be optionally pre-molded.

Figure 8:
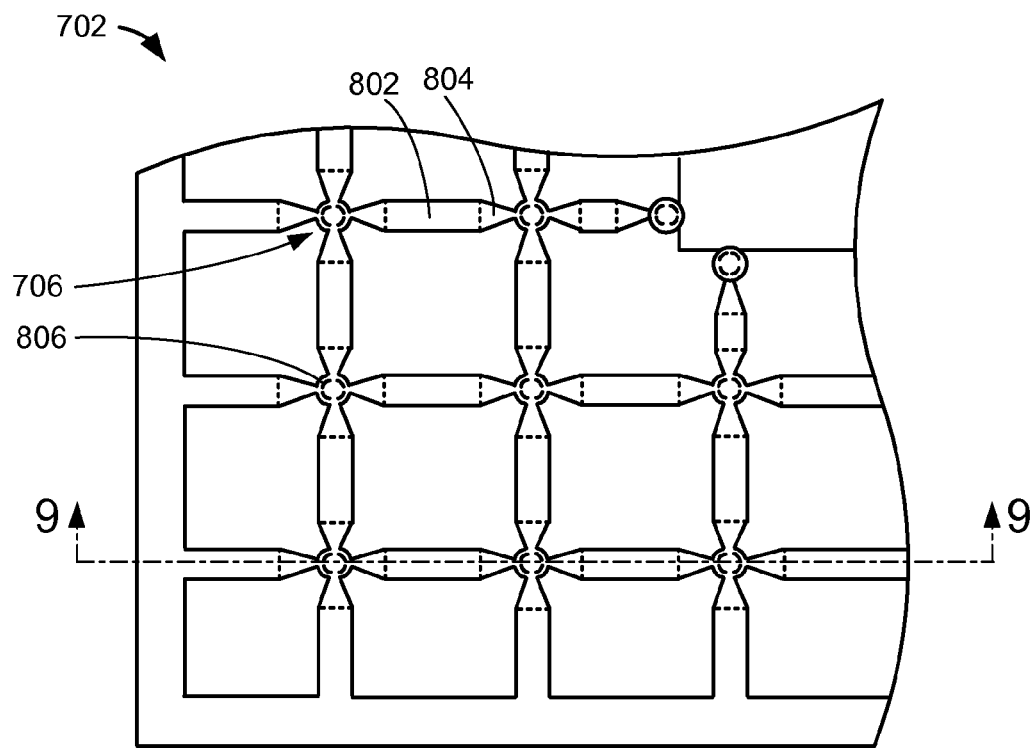
FIG. 8 is a more detailed top view of a corner portion of the structure of FIG. 7.

Referring now to FIG. 8, therein is shown a more detailed top view of a corner portion of the structure of FIG. 7. The second lead frame 702 may be used for forming the integrated circuit package system 500 with the external interconnects 508 of FIG. 5 having the narrow portion 514 of FIG. 5. The second lead frame 702 includes a contact portion 802 in a geometric shape of a rectangle and a narrow end 804 indicated by dotted lines as the boundary between the contact portion 802 and the narrow end 804. The narrow end 804 may connect to the intersecting regions 706 of the second lead frame 702. As an example, the intersecting regions 706 are shown in a circular geometric configuration. The dotted circle in the intersecting regions 706 may depict a ring 806 at a peripheral portion of the intersecting regions 706.

The array of the external interconnects 508 may be formed from the second lead frame 702 by removing the intersecting regions 706 and part of the narrow end 804 thereby separating and isolating the external interconnects 508 from each other. Similar removal process may be used as described in FIG. 4. Partial removal of the narrow end 804 may form the narrow portion 514 of FIG. 5. The internal interconnects 512 of FIG. 5 may connect the integrated circuit die 504 of FIG. 5 with the contact portion 802 of the external interconnects 508.

Figure 9:
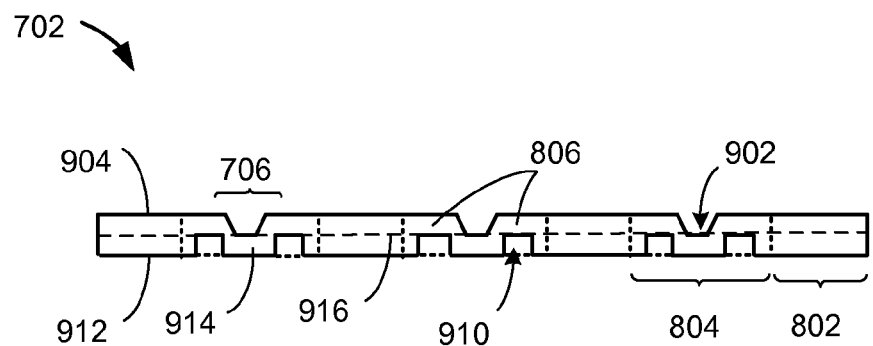
FIG. 9 is a cross-sectional view of the second lead frame along line 9-9 of FIG. 8.

Referring now to FIG. 9, therein is shown a cross-sectional view of the second lead frame 702 along line 9-9 of FIG. 8. The vertical dotted lines depict the boundaries between the narrow end 804 and the contact portion 802. The intersecting regions 706 are shown with a notch 902 from a top side 904 of the second lead frame 702. The notch 902 is optional. The intersecting regions 706 are also shown with a recess 910 from a bottom side 912 of the second lead frame 702. The recess 910 forms the ring 806 around a non-recessed portion 914 of the intersecting regions 706. The recess 910 is optional in the narrow end 804 shown with horizontal dotted segments depicting the narrow end 804 without the recess 910. The bottom surface may be planarized to a dotted line 916 to form the final structure.

The narrow end 804 may form the narrow portion 514 of FIG. 5 that is coplanar to the exposed side of the external interconnects 508 as described in FIG. 6. The isolation holes 510 of FIG. 6 may be formed over or not over the interior top side of the external interconnects 508, as described in FIG. 6, by removing the non-recessed portion 914 of the intersecting regions 706.

It has been discovered that the present invention improved reliability in the manufacturing of the integrated circuit package system 500 of FIG. 5. The narrow end 804 and the notch 902 in the intersecting regions 706 reduces the depth the isolation holes 510 of FIG. 5 for forming the external interconnects 508 of FIG. 5 avoiding contamination, chipping, or delamination to the integrated circuit package system 500. The ring 806 provides the narrow portion 514 of FIG. 6 above the bottom side 912 with the removal of the intersecting region and serving to form a mold lock feature of the external interconnects 508 in the integrated circuit package system 500.

Figure 10:
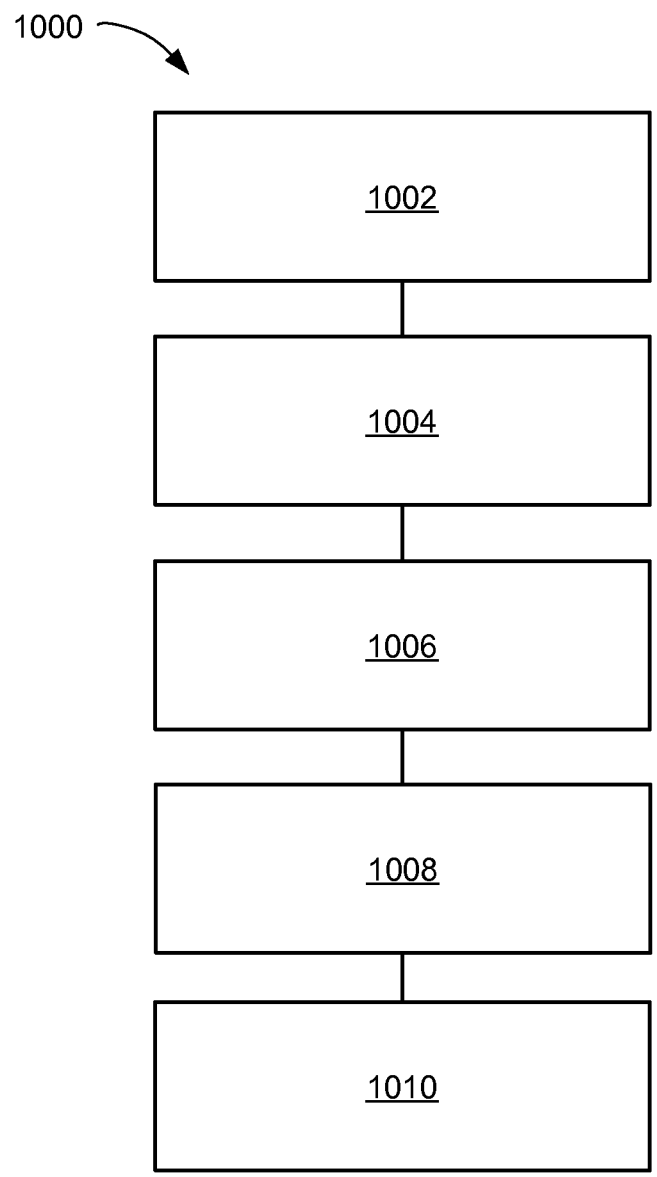
FIG. 10 is a flow chart of an integrated circuit package system for manufacturing of the integrated circuit package system in an embodiment of the present invention.

Referring now to FIG. 10, therein is shown a flow chart of an integrated circuit package system 1000 for manufacturing of the integrated circuit package system 100 in an embodiment of the present invention. The system 1000 includes forming an array of external interconnects with an intersecting region between the external interconnects in a block 1002; removing the intersecting region for forming an isolation hole between the external interconnects in a block 1004; mounting an integrated circuit die over the external interconnects in a block 1006; connecting an internal interconnect between the integrated circuit die and the external interconnects in a block 1008; and forming a package encapsulation over the integrated circuit die with the external interconnects partially exposed in a block 1010.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package-in-package system of the present invention furnishes important and heretofore unknown and unavailable solutions, capabilities, and functional aspects for improving yield, increasing reliability, and reducing cost of circuit system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit package system comprising:
   a conductive grid, comprising a die-attach paddle in a central area of the conductive grid, and an array of external interconnects having an intersecting region between the external interconnects with isolation holes between the external interconnects, wherein one of the isolation holes borders four of the external interconnects at the intersecting region;
   an array encapsulation on and between the external interconnects;
   an integrated circuit die over the die-attach paddle;
   an internal interconnect between the integrated circuit die and the external interconnects; and
   a package encapsulation over the integrated circuit die with the external interconnects partially exposed includes the package encapsulation extending into the isolation holes and being in contact with the array encapsulation.

2. The system as claimed in claim 1 wherein the isolation holes have a curved shaped opening.

3. The system as claimed in claim 1 wherein the package encapsulation is in contact with the external interconnects.

4. The system as claimed in claim 1 wherein the array of the external interconnects includes a narrow portion adjacent to each of the isolation holes.

5. The system as claimed in claim 1 wherein:
the array of the external interconnects includes:
   a narrow portion adjacent to each of the isolation holes, and
the package encapsulation includes:
   the package encapsulation under the narrow portion.

6. The system as claimed in claim 1 wherein:
the array of the external interconnects include an array of leads; and
the package encapsulation is in contact with the external interconnects.

7. The system as claimed in claim 6 wherein:
the package encapsulation is formed from the same material as the array encapsulation.

8. The system as claimed in claim 6 wherein at least one of the isolation holes is between the die-attach paddle and the leads.

9. The system as claimed in claim 6 wherein the array of the leads includes a nickel-palladium material.

10. The system as claimed in claim 6 wherein the internal interconnects are bond wires.

\* \* \* \* \*